US007935217B2

(12) United States Patent
Yashiki et al.

(10) Patent No.: US 7,935,217 B2
(45) Date of Patent: May 3, 2011

(54) SUBSTRATE PROCESSING APPARATUS FOR TREATING SUBSTRATE WITH PREDETERMINED PROCESSING BY SUPPLYING PROCESSING LIQUID TO RIM PORTION OF ROTATING SUBSTRATE

(75) Inventors: Hiroyuki Yashiki, Kyoto (JP); Eiji Fukatsu, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 565 days.

(21) Appl. No.: 11/355,334

(22) Filed: Feb. 16, 2006

(65) Prior Publication Data

US 2006/0185792 A1    Aug. 24, 2006

(30) Foreign Application Priority Data

Feb. 22, 2005   (JP) ................. 2005-045446

(51) Int. Cl.
*H01L 21/027* (2006.01)
*H01L 21/304* (2006.01)
*B08B 11/02* (2006.01)

(52) U.S. Cl. .............. 156/345.17; 156/345.15; 134/902; 134/113

(58) Field of Classification Search .......... 134/902, 134/113, 345.15, 56 R; 156/345.15, 345.24, 156/345.21, 345.17; 118/664, 712, 671
See application file for complete search history.

(56) References Cited

U.S. PATENT DOCUMENTS

| | | | | |
|---|---|---|---|---|
| 4,569,717 A | * | 2/1986 | Ohgami et al. | 216/85 |
| 5,028,955 A | * | 7/1991 | Hayashida et al. | 355/53 |
| 5,176,783 A | * | 1/1993 | Yoshikawa | 156/345.15 |
| 5,244,527 A | * | 9/1993 | Aoyagi | 156/345.16 |
| 5,785,068 A | * | 7/1998 | Sasaki et al. | 134/144 |
| 6,453,916 B1 | * | 9/2002 | Tran et al. | 134/58 R |
| 6,494,221 B1 | * | 12/2002 | Sellmer et al. | 134/147 |
| 6,605,153 B2 | * | 8/2003 | Kitano et al. | 118/57 |
| 6,827,814 B2 | * | 12/2004 | Taniyama et al. | 156/345.12 |
| 7,332,056 B2 | * | 2/2008 | Kobayashi et al. | 156/345.17 |
| 2005/0205521 A1 | * | 9/2005 | Kume et al. | 216/87 |

FOREIGN PATENT DOCUMENTS

| | | |
|---|---|---|
| JP | 61-85650 | 5/1986 |
| JP | 6-165975 | 6/1994 |
| JP | 9-17706 | 1/1997 |
| JP | 2001-44118 | 2/2001 |
| JP | 2001-102287 | 4/2001 |
| JP | 2004-261705 | 9/2004 |

OTHER PUBLICATIONS

Notification of Reasons for Refusal issued Dec. 22, 2009 in connection with corresponding Japanese Patent Application No. JP2005-045446.

* cited by examiner

*Primary Examiner* — Sylvia R. MacArthur
(74) *Attorney, Agent, or Firm* — Ostrolenk Faber LLP

(57) ABSTRACT

A bevel unit comprises CCDs and processing liquid nozzles, and the CCDs take an image of a circumferential edge surface of a substrate. An image processing part detects the distances between the circumferential edge surface of the substrate and the processing liquid nozzles by image processing the signals from the CCDs. A control unit compares thus detected distances between the circumferential edge surface of the substrate and the processing liquid nozzles with set distances from the circumferential edge surface of the substrate to the processing liquid nozzles which are set in a recipe so as to be a desired rim etching width, and calculates an amount of displacement between the detected distances and the set distances. In accordance with the amount of displacement, the control unit activates motors and accordingly positions the bevel unit.

6 Claims, 7 Drawing Sheets

F I G. 5 A
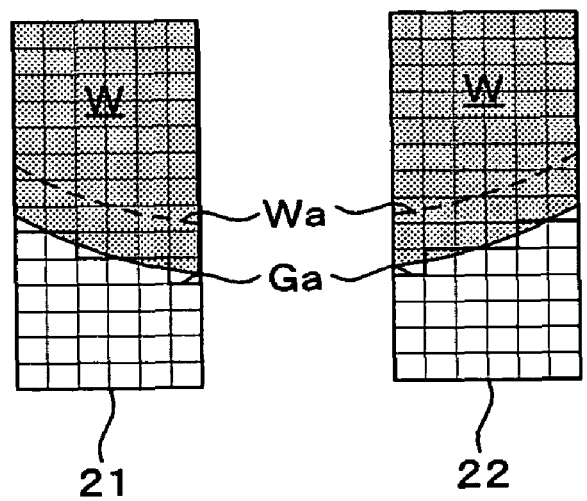
F I G. 5 B
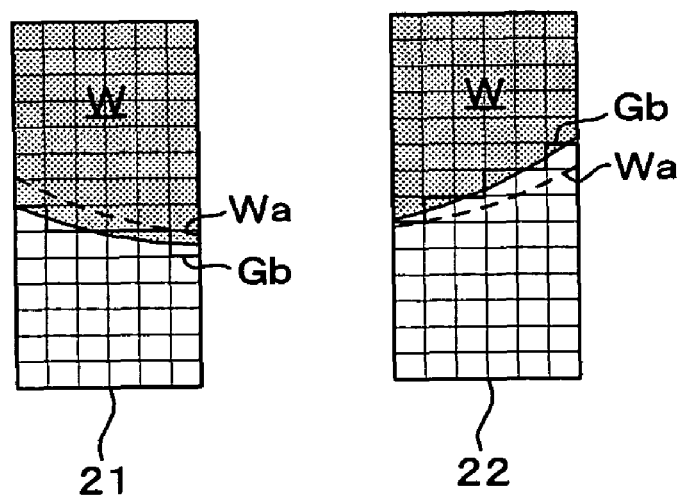

F I G. 6
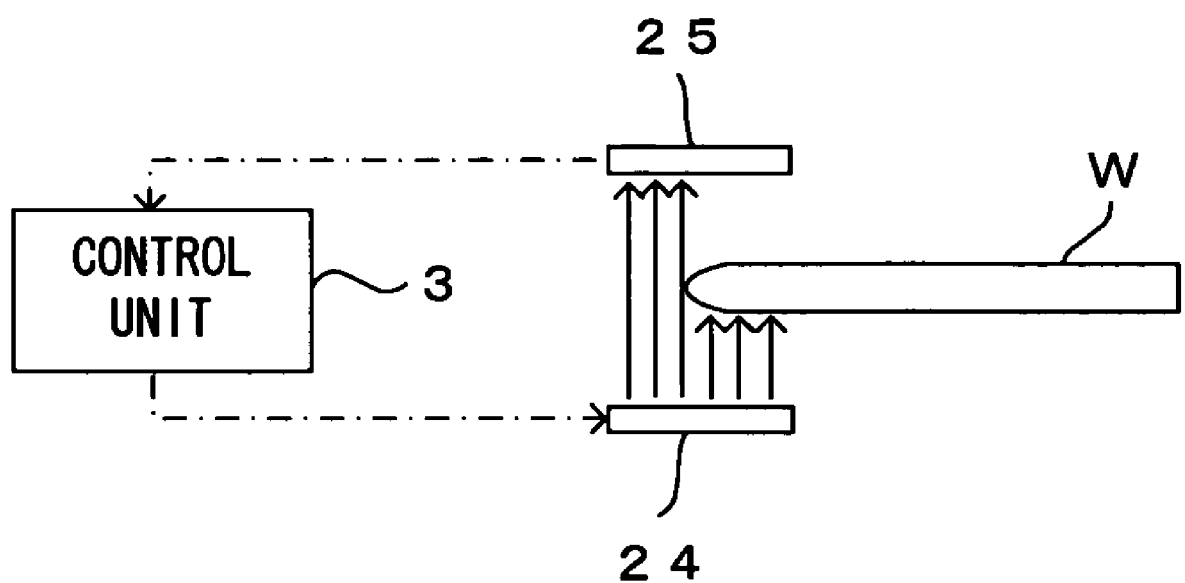

F I G. 7
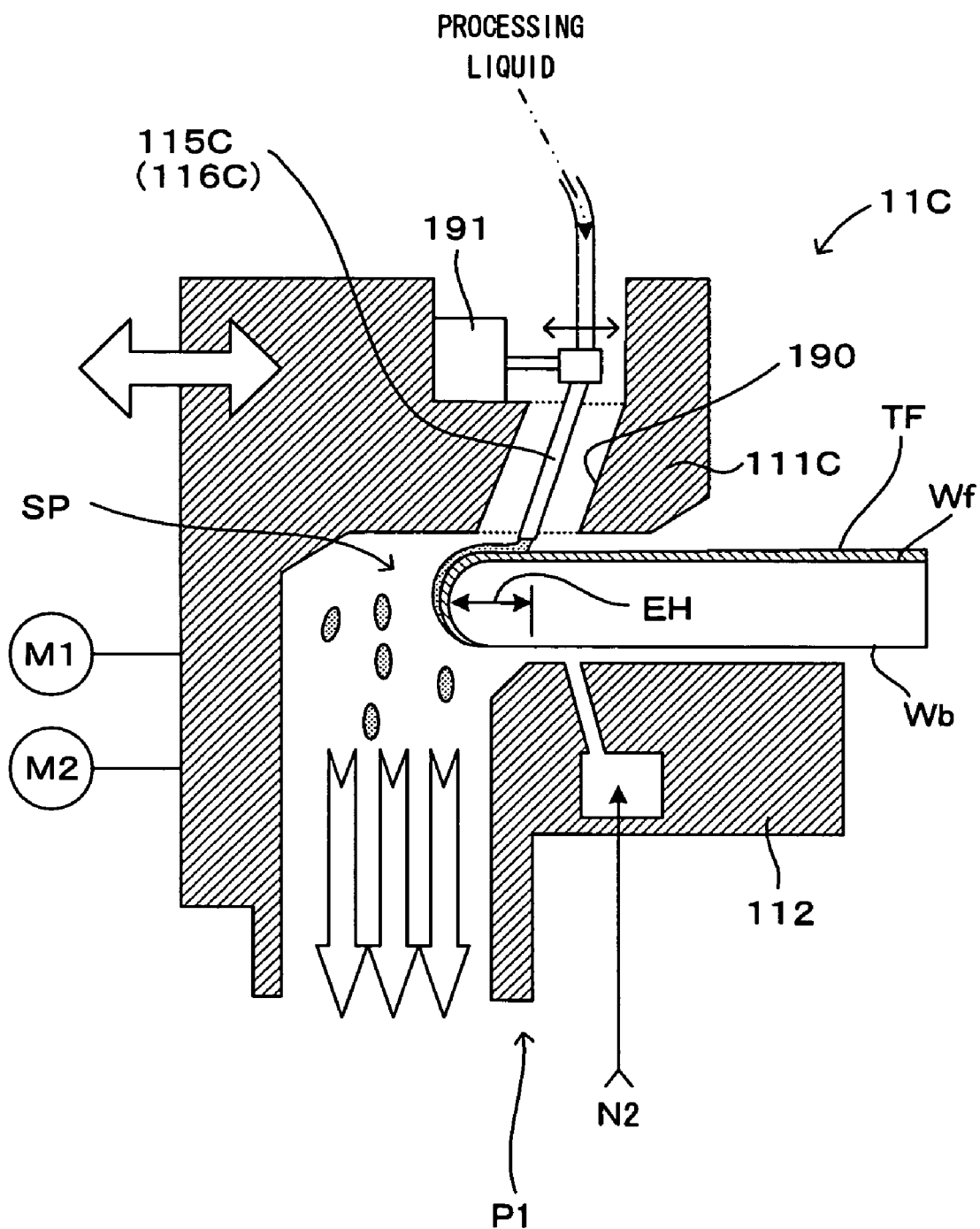

SUBSTRATE PROCESSING APPARATUS FOR TREATING SUBSTRATE WITH PREDETERMINED PROCESSING BY SUPPLYING PROCESSING LIQUID TO RIM PORTION OF ROTATING SUBSTRATE

CROSS REFERENCE TO RELATED APPLICATION

The disclosure of Japanese Patent Application No. 2005-045446 filed Feb. 22, 2005 including specification, drawings and claims is incorporated herein by reference in its entirety.

BACKGROUND OF THE INVENTION

1. Field of the Invention

The present invention relates to a substrate processing apparatus and method in which a substrate such as a semiconductor wafer is treated with predetermined processing, such as cleaning, by supplying a processing liquid to the rotating substrate.

2. Description of the Related Art

In processing of a substrate such as a semiconductor wafer, after forming a thin film such as a photoresist on all over the surface of the substrate by spin coating for instance, there may be a case that an etching is performed to remove an unwanted part of the thin film. Generally, it is only a device forming region within the surface of the substrate that needs film formation, and the thin film formed in a rim portion of the surface and a circumferential edge surface of the substrate is not required. The thin film present in the rim portion of the surface and the circumferential edge surface of the substrate is not only unnecessary but could lead to a lower yield or other trouble in a substrate processing apparatus itself when it has fallen due to contact with other apparatus.

For selective etching or other removal of a thin film present in a rim portion of a surface and a circumferential edge surface of a substrate, such an apparatus as that described in Japanese Unexamined Patent Application Publication No. H9-17706 for example has been proposed. In this apparatus, a substrate, on a whole surface of which a thin film of a photoresist is formed, is sucked and held by a spin chuck to rotate. A nozzle is then moved to a feeding position which corresponds to a rim portion of the rotating substrate and supplies a processing liquid, thereby removing the thin film formed in the rim portion of the surface and the circumferential edge surface of the substrate.

SUMMARY OF THE INVENTION

By the way, the substrate processing described above is performed for the purpose of removing the thin film within a certain range from the edge of a non-processing section provided approximately at the center of the surface of the substrate. It is desired that the dimensional accuracy of the removal range, namely, the width of etching (hereinafter referred to as the "rim etching width") which extends inward from the circumferential edge surface is strictly controlled. Particularly in the event that a metal layer of copper or the like is formed as the thin film on the surface of the substrate, since the object of the substrate processing described above is to remove the metal in the vicinity of circumferential edge surface (bevel), it is required that the rim etching width is controlled precisely and also uniformly all around the substrate. To meet this requirement, it is necessary to align the physical center of the substrate to the center of rotations accurately where a nozzle is fixed above the rim portion of the surface of the substrate and injects a processing liquid as in the conventional apparatus. However, it is difficult in the conventional apparatus to control the rim etching width at a high accuracy since the overall sizes of substrates are not even (e.g., the diameter of one substrate is not constant along the circumferential direction, the diameters of the substrates are found different between different lots during processing of the substrates). In other words, since the nozzle is fixed above the rim portion of the surface of the substrate and discharges the processing liquid although the distance between the nozzle and the circumferential edge surface of the substrate is not precisely the same as a desired value, namely, the rim etching width because of the uneven overall size of the substrate in the conventional apparatus, it is difficult to accurately control the rim etching width uniformly all around the substrate.

An object of the present invention is to provide a substrate processing apparatus and a substrate processing method with which it is possible to control the rim etching width precisely and also uniformly all around the substrate.

According to a first aspect of the present invention, there is provided a substrate processing apparatus which treats a substrate with predetermined processing by supplying a processing liquid to said substrate while rotating said substrate, comprising: a bevel unit which includes a nozzle which supplies said processing liquid to a rim portion of said substrate, and which is structured to move freely toward the rim portion of said substrate; a drive mechanism which moves said nozzle to an opposed position and to a far position by driving said bevel unit, the opposed position being a position which is opposed against the rim portion of said substrate, and the far position being a position which is away from said substrate; a detecting element which performs non-contact detection of a distance between said nozzle and a circumferential edge surface of said substrate; and a controller which adjusts the distance between said nozzle and the circumferential edge surface of said substrate by controlling said drive mechanism based on a detection signal from said detecting element.

According to a second aspect of the present invention, there is provided a substrate processing apparatus which treats a substrate with predetermined processing by supplying a processing liquid to said substrate while rotating said substrate, comprising: a nozzle which supplies said processing liquid to a rim portion of said substrate, and which is structured to move freely in the vicinity of the rim portion of said substrate; a nozzle drive mechanism which moves said nozzle in opposing against the rim portion of said substrate by driving said nozzle, a detecting element which performs non-contact detection of a distance between said nozzle and a circumferential edge surface of said substrate; and a controller which adjusts the distance between said nozzle and the circumferential edge surface of said substrate by controlling said nozzle drive mechanism based on a detection signal from said detecting element.

According to a third aspect of the present invention, there is provided a substrate processing method, comprising the steps of: executing non-contact detection of a distance between a nozzle and a circumferential edge surface of a rotating substrate; adjusting the distance between the nozzle and the circumferential edge surface of the substrate by moving the nozzle opposing against a rim portion of the substrate based on a result of the detection; and treating the substrate with predetermined processing by supplying a processing liquid from the nozzle to the rim portion of the rotating substrate.

The above and further objects and novel features of the invention will more fully appear from the following detailed description when the same is read in connection with the accompanying drawing. It is to be expressly understood,

BRIEF DESCRIPTION OF THE DRAWINGS

FIG. 5 is a drawing for describing the operations of the substrate processing apparatus shown in FIG. 1.

FIG. 6 is a drawing of a modified embodiment of the substrate processing apparatus shown in FIG. 1.

FIG. 7 is a drawing of another modified embodiment of the substrate processing apparatus shown in FIG. 1.

DETAILED DESCRIPTION OF THE PREFERRED EMBODIMENTS

Figure 1:
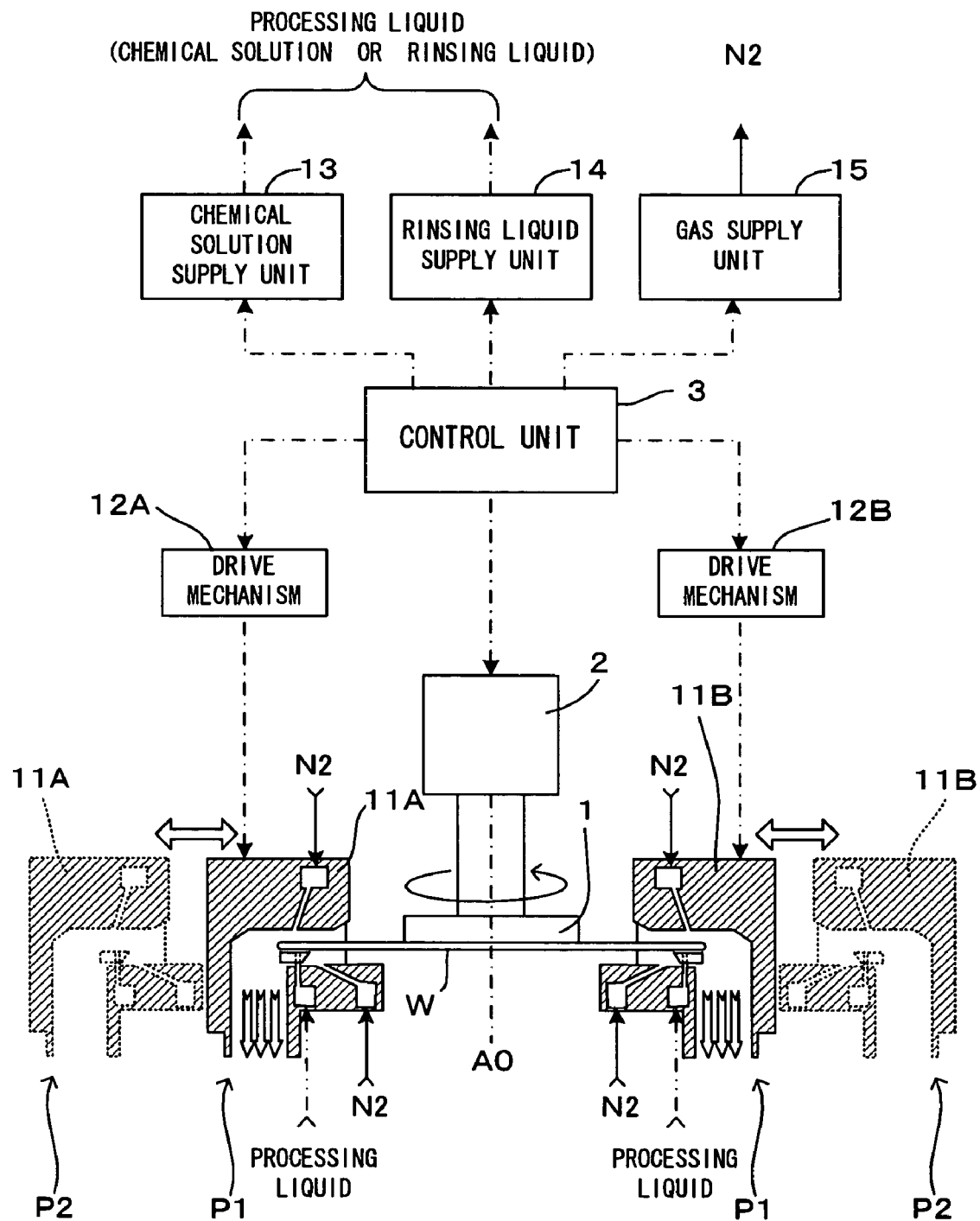
FIG. 1 is a drawing which shows an overall structure of an embodiment of a substrate processing apparatus according to the invention.
Figure 2:
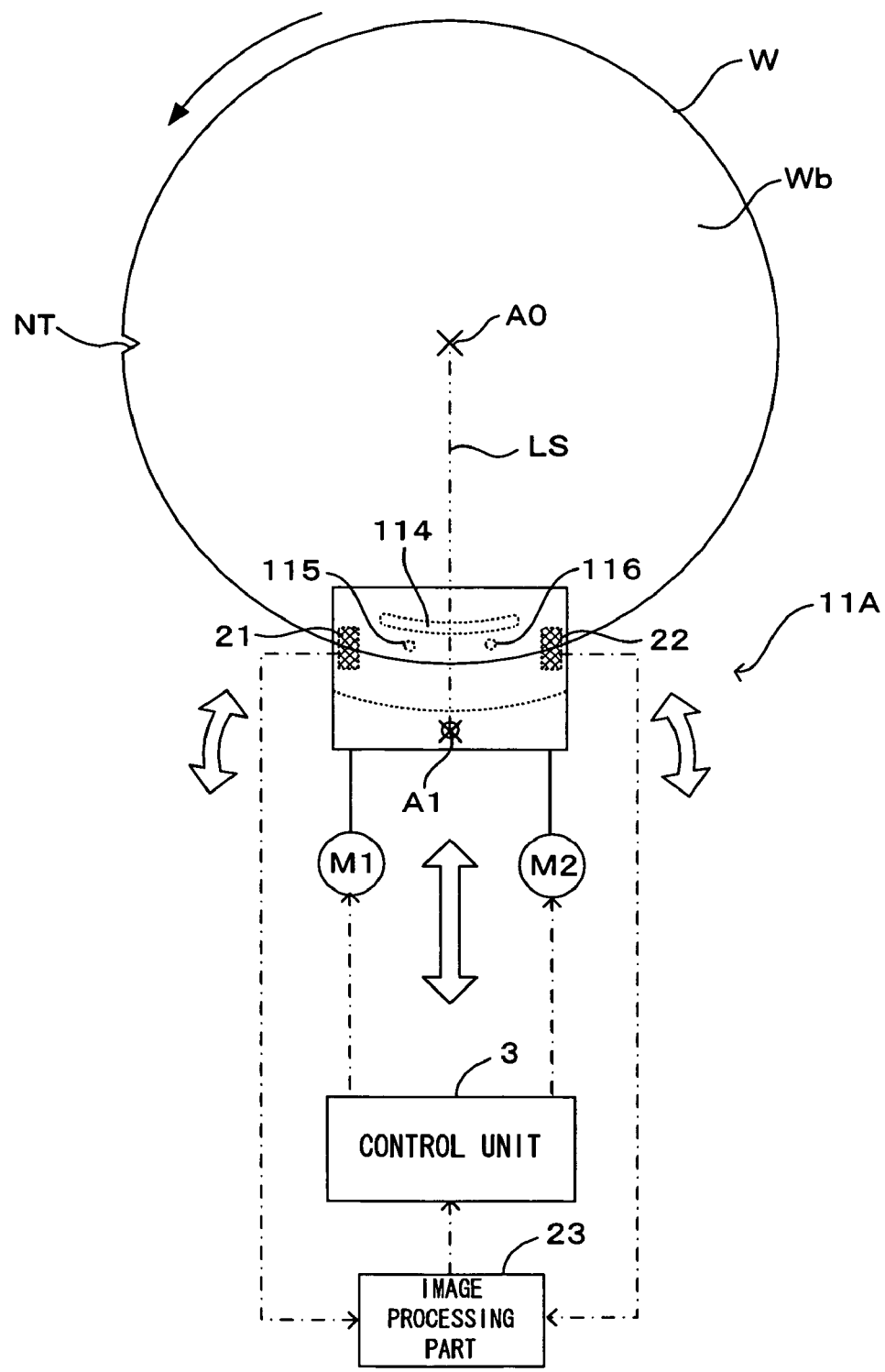
FIG. 2 is a partial plan view of the substrate processing apparatus shown in FIG. 1.
Figure 3:
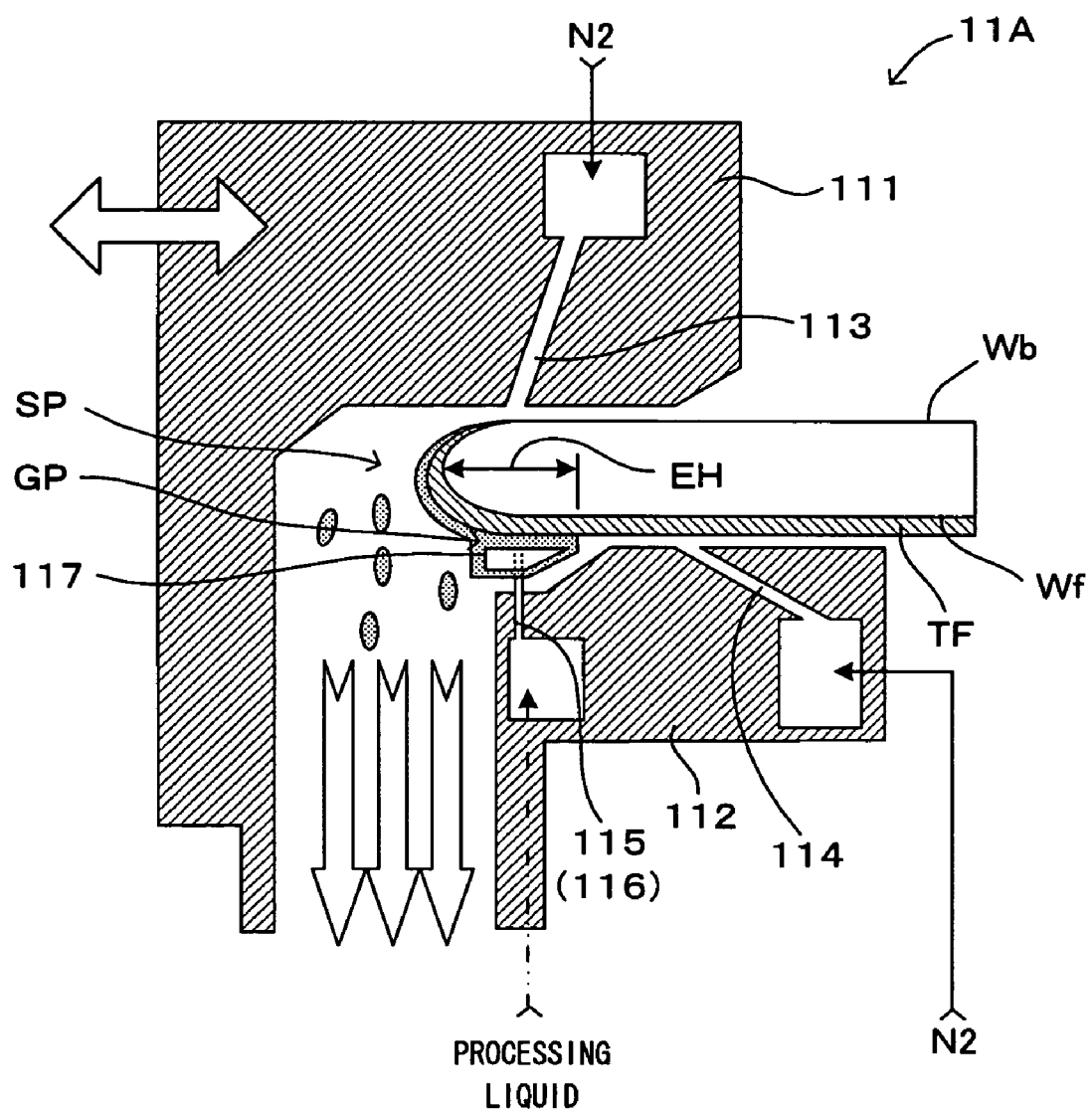
FIG. 3 is a partial enlarged view of the substrate processing apparatus shown in FIG. 1.

FIG. 1 is a drawing which shows an overall structure of the substrate processing apparatus according to the invention. FIG. 2 is a partial plan view of the substrate processing apparatus shown in FIG. 1. FIG. 3 is a partial enlarged view of the substrate processing apparatus shown in FIG. 1. This substrate processing apparatus is a bevel etching apparatus which removes by etching a thin film such as a metal layer and a photoresist layer from a rim portion of a surface of a substrate such as a semiconductor wafer. This substrate processing apparatus is, more specifically, an apparatus which treats a substrate W with chemical processing, rinsing or other processing by supplying a chemical solution such as a chemical agent, an organic solvent or the like and a rinsing liquid which may be pure water or DIW (hereinafter referred to as the "processing liquids") to a rim portion of a surface of the substrate.

This substrate processing apparatus comprises a vacuum chuck 1 which sucks and holds the substrate W approximately at the center of a back surface Wb of the substrate W such that the substrate W remains face down, i.e., directs its front surface Wf toward below. Hence, the substrate W, on the front surface Wf of which a thin film TF such as a metal layer, a photoresist layer, or the like is formed, is aligned to a predetermined substrate processing position in a face-down posture and approximately horizontally. A motor 2 is linked to the rear end of the vacuum chuck 1 and rotates about a vertical axis in response to an operation command from a control unit 3 which controls the whole apparatus. The vacuum chuck 1 rotates by driving the motor, thereby rotating the substrate W which is held by the vacuum chuck 1 about a rotation axis (the rotation center A0) which extends in the vertical axis.

Disposed around the substrate W which is held by the vacuum chuck 1 are bevel units 11A and 11B which are each movable in the horizontal direction. Describing in more detail, the bevel units 11A and 11B are disposed so that they can freely move in a radial direction of the substrate W or about a rotation axis (the rotation center A1) which extends in the direction of vertical axis (the direction of the rotation axis of the substrate W). Drive mechanisms 12A and 12B are linked respectively to the bevel units 11A and 11B. Hence, as the drive mechanisms 12A and 12B operate in response to an operation command from the control unit 3, the bevel units 11A and 11B move close to the rim portion of the substrate W, and processing liquid nozzles, which are disposed to the bevel units 11A and 11B and will be described later, are aligned to opposed positions P1 facing the rim portion of the substrate W (the positions denoted at the solid lines) or far positions P2 which are away from the substrate W (the positions denoted at the dotted lines). The structures and operations of the drive mechanisms 12A and 12B will be described later in detail.

The two bevel units 11A and 11B have the identical structures, execute etching as described later with a chemical solution suitable to etching supplied from a chemical solution supply unit 13, and execute rinsing as described later with a rinsing liquid such as pure water or DIW supplied from a rinsing liquid supply unit 14. Further, a gas supply unit 15 is connected to gas nozzles of the bevel units 11A and 11B and supplies nitrogen gas to each nozzle. To be more specific, the bevel units 11A and 11B have the following structures. Since the bevel units 11A and 11B have the identical structures, the structure of the bevel unit 11A alone will now be described and the structure of the bevel unit 11B will not be described.

As shown in FIG. 3, the bevel unit 11A comprises a main unit section which is obtained by linking two main unit members 111 and 112. In this main unit section, there is a space SP slightly wider than the thickness of the substrate W between the main unit members 111 and 112. As the bevel unit 11A, driven by the drive mechanism 12A, moves close to the rim portion of the substrate W, the circumferential edge surface of the substrate W goes inside the bevel unit 11A, which brings the back surface Wb and the front surface Wf (thin film formed surface) of the substrate W opposed against the main unit members 111 and 112 respectively.

Of the main unit members 111 and 112, the main unit member 111 opposed against the back surface Wb of the substrate bears a gas nozzle 113. As described above, the gas nozzle 113 is connected with the gas supply unit 15 and injects nitrogen gas toward the rim portion from the back surface Wb side. This prevents splashing and adherence of the processing liquid (such as the chemical solution and the rinsing liquid) to the back surface Wb during bevel etching (etching+rinsing) in the manner described later and stabilizes the bevel etching. Although nitrogen gas is supplied to the gas nozzle 113 in this embodiment, air or other inert gas may be discharged.

The main unit member 112 for the front surface bears a gas nozzle 114 and two processing liquid nozzles 115 and 116 (which correspond to the "nozzle" of the present invention). Like the gas nozzle 113, the gas nozzle 114 is connected with the gas supply unit 15 and discharges nitrogen gas toward the rim portion from the front surface Wf side. This brings about the Bernoulli's effect owing to which the front surface Wf of the substrate floats up as it remains in the proximity of the main unit member 112 opposed against the front surface and the distance between the front surface Wf of the substrate and the main unit member 112 opposed against the front surface stays constant.

The two processing liquid nozzles 115 and 116 are located on the outer side of the substrate relative to the gas nozzle 114 (i.e., on the left-hand side in FIG. 3), and the nozzle 115 is for injection of the chemical solution while the nozzle 116 is for injection of the rinsing liquid (FIG. 2). The chemical solution nozzle 115 is disposed on the upstream side in the rotation direction of the substrate relative to the rinsing liquid nozzle 116. The chemical solution nozzle 115 is connected with the chemical solution supply unit 13, and the rinsing liquid nozzle 116 is connected with the rinsing liquid supply unit 14. Hence, as the chemical solution is pumped in under pressure from the chemical solution supply unit 13 in response to an operation command from the control unit 3, the chemical solution nozzle 115 injects out the chemical solution toward the rim portion of the front surface Wf of the substrate, and as the rinsing liquid is pumped in under pressure from the rinsing liquid supply unit 14, the rinsing liquid nozzle 116 injects out the rinsing liquid toward the rim portion of the front surface Wf of the substrate. Although, in this embodiment, the two processing liquid nozzles, one being the chemical solution nozzle 115 and the other being the rinsing liquid nozzle 116, are disposed in such a manner that the chemical solution nozzle 115 is on the upstream side in the rotation direction of the substrate relative to the rinsing liquid nozzle 116, the number, the arrangement and the like of the processing liquid nozzles may be determined freely. The rinsing liquid nozzle 116 may be disposed on the upstream side in the rotation direction of the substrate relative to the chemical solution nozzle 115.

A processing defining member 117, whose cross sectional shape is trapezoidal and which defines opposed surface which is parallel to the front surface Wf of the substrate, is attached to each of the top ends of the processing liquid nozzles 115 and 116 respectively. The processing defining members 117 are disposed in the proximity of the rim portion of the front surface Wf of the substrate (FIG. 3). Hence, as the chemical solution is pumped in under pressure from the chemical solution supply unit 13 in response to an operation command from the control unit 3, the chemical solution nozzle 115 injects out the chemical solution, the chemical solution fills up a microspace GP liquid-tight which is formed between the processing defining member 117 and the rim portion of the front surface Wf of the substrate, and a part of the chemical solution spreads toward the outer side of the substrate beyond the processing defining member 117. This ensures no supply of the chemical solution to the inner side of the substrate in the radial direction of the substrate W (the right-hand side in FIG. 3) relative to the processing defining member 117, and in this manner, the range of etching with the chemical solution, namely, the rim etching width EH is determined by the position of the processing defining member 117. Describing further specifically, since it is possible to set the amount of movements of the bevel unit 11A successively as described above, control of the amount of movements of the bevel unit 11A changes the position of the processing defining member 117 and adjusts the rim etching width EH to any desired width.

Although the foregoing has described an example of pumping the chemical solution under pressure to the chemical solution nozzle 115, pumping of the rinsing liquid under pressure to the rinsing liquid nozzle 116 is similar. That is, as the rinsing liquid is pumped in under pressure from the rinsing liquid supply unit 14 in response to an operation command from the control unit 3, the rinsing liquid nozzle 116 discharges the rinsing liquid, the rinsing liquid fills up the micro-space GP liquid-tight which is formed between the processing defining member 117 and the rim portion of the front surface Wf of the substrate, and a part of the rinsing liquid spreads toward the outer side of the substrate beyond the processing defining member 117. It is thus possible to control the range in which the rinsing liquid is supplied.

As shown in FIG. 2, for detection of the distances between the circumferential edge surface of the substrate W and the processing liquid nozzles 115 and 116, the bevel unit 11A comprises two CCDs 21 and 22 (corresponding to the "imaging part" of the present invention) which take an image of the rim portion of the substrate W, and an image processing part 23 (corresponding to the "processing part" of the present invention) which detects the position of the circumferential edge surface of the substrate W by processing image signals from the CCDs 21 and 22. The two CCDs 21 and 22 are disposed approximately symmetrical to each other with respect to a line segment LS which connects the rotation center A0 of the substrate W with the rotation center A1 of the bevel unit 11A, and take an image of the rim portion of the substrate W when the bevel unit 11A is aligned to the opposed position P1. The CCD 21 is located on the upstream side to the chemical solution nozzle 115 and away from the chemical solution nozzle 115, while the CCD 22 is located on the downstream side to the rinsing liquid nozzle 116 and away from the rinsing liquid nozzle 116.

The two CCDs 21 and 22 are disposed as described above for the following reason. With respect to detection of the distances between the circumferential edge surface of the substrate W and the processing liquid nozzles 115 and 116, there may be only one CCD in the vicinity of the processing liquid nozzles 115 and 116. However, in the case where a CCD is disposed in the vicinity of the processing liquid nozzles 115 and 116, the detection accuracy may deteriorate if the processing liquid from the nozzles gets splashed and adheres to the CCD. Noting this, the CCDs 21 and 22 are disposed away from the processing liquid nozzles 115 and 116, which prevents adhesion of the processing liquid. Further, since the two CCDs 21 and 22 are disposed on the both sides of the processing liquid nozzles 115 and 116, it is possible to accurately calculate the position of the circumferential edge surface of the substrate W against which the processing liquid nozzles 115 and 116 are opposed based on the image signals from the CCDs 21 and 22. It is therefore possible to precisely detect the position of the circumferential edge surface of the substrate W without any influence of the processing liquid injected at the processing liquid nozzles 115 and 116.

When the bevel unit 11A is aligned to the opposed position P1, the CCDs 21 and 22 take an image of the rim portion of the substrate W, namely, the boundary between the substrate W and the space outside the substrate W (the contour outline of the substrate W) in a condition that imaging surfaces of the CCDs 21 and 22 are directed toward the front surface Wf of the substrate. To this end, the range of image taking with the CCDs 21 and 22 is set to such a range that it is possible to pick up a change of the position of the circumferential edge surface of the substrate W from the rotation center A0 of the substrate W associated with rotation of the substrate W even when the rim etching width EH is adjusted to any desired value.

The images of the rim portion of the substrate W taken with the CCDs 21 and 22 are output as image signals to the image processing part 23. The image processing part 23 performs predetermined signal processing such as binarization, thereby extracting the contour outline of the substrate W and detecting the position of the circumferential edge surface of the substrate W. Since the CCDs 21 and 22 are attached fixedly to the bevel unit 11A, the distances between the CCDs 21 and 22 and the processing liquid nozzles 115 and 116 relative to each other are constant. Hence, detection of the position of the circumferential edge surface of the substrate W makes it possible to detect the distances between the circumferential edge surface of the substrate W and the processing liquid nozzles 115 and 116.

The substrate W to be processed often has a cutout portion. For instance, where the substrate W is a semiconductor wafer, the semiconductor wafer has a cutout portion such as a notch NT in order to indicate the crystallographic reference orientation within the plane of the wafer (FIG. 2). In this instance, when the CCDs 21 and 22 take the images of the notch NT and the image processing part 23 detects the distances between the circumferential edge surface of the substrate W and the processing liquid nozzles 115 and 116 based on thus taken images, the detection of the precise distance is impossible. To remove the influence of the notch NT therefore, it is preferable that the image processing part 23 has a filtering function.

To be more specific, the pattern shape of the notch NT is registered in advance to the image processing part 23 for instance, and then, is checked against the image pattern obtained by the CCDs 21 and 22 (pattern matching). When the image pattern obtained by the CCDs 21 and 22 includes a portion which matches with the pattern shape of the notch NT which has been registered in advance to the image processing part 23, pattern information regarding the matched portion may be deleted from basic information for the detection of the distance. By the structure described above, detection of the distances between the circumferential edge surface of the substrate W and the processing liquid nozzles 115 and 116 based on the image information exclusive of the notch NT is possible, and hence, the precise distance is obtained.

The image processing part 23 is connected with the control unit 3, and the control unit 3 compares the distances between the circumferential edge surface of the substrate W and the processing liquid nozzles 115 and 116 detected by the image processing part 23 (hereinafter referred to simply as the "detected distances") with set distances from the circumferential edge surface of the substrate W to the processing liquid nozzles 115 and 116 which are set in a recipe or the like so as to be the desired rim etching width EH (hereinafter referred to simply as the "set distances") and calculates the amount of displacement between the detected distances and the set distances. The control unit 3 then activates the drive mechanism 12A in accordance with the amount of displacement between the detected distances and the set distances, and drives the bevel unit 11A so that the desired rim etching width EH will be obtained.

The drive mechanisms 12A and 12B which drive the bevel units 11A and 11B will now be described. Since the drive mechanisms 12A and 12B have the identical structures, the structure of the bevel unit 11A alone will now be described and the structure of the bevel unit 11B will not be described. The drive mechanism 12A comprises two motors M1 and M2 corresponding to the two CCDs 21 and 22 respectively, and these two motors M1 and M2 are linked to the bevel unit 11A. The control unit 3 activates the motors M1 and M2, whereby the bevel unit 11A moves closer to the rim portion of the substrate W or away from the rim portion of the substrate W in a radial direction of the substrate W, and revolves about the rotation center A1, both in a horizontal direction. The drive mechanism comprising such motors M1 and M2 may be a known mechanism such as a feed screw mechanism which uses a guide and a ball screw. Actuators in general, including air cylinders, may be used for the drive mechanisms instead of using only motors.

The drive force from the motors M1 and M2 acts upon the bevel unit 11A in directions which are approximately symmetrical to each other with respect to the line segment LS and are parallel to the line segment LS, the line segment LS connecting the rotation center A0 of the substrate W with the rotation center A1 of the bevel unit 11A. Hence, when the two motors M1 and M2 provide synchronized drive (that is, the magnitude and the direction of the drive force from the motor M1 and those from the motor M2 are identical to each other) in response to an operation command from the control unit 3, equal force acts upon the bevel unit 11A with respect to the line segment LS as a center, whereby the bevel unit 11A moves in parallel in a radial direction of the substrate W without rotating. Driven by the two motors M1 and M2 in this fashion, the bevel unit 11A is positioned at a high accuracy. When the motors M1 and M2 are driven in the forward direction, the bevel unit 11A moves closer to the rim portion of the substrate W, and when the motors M1 and M2 are driven in the backward direction, the bevel unit 11A moves away from the rim portion of the substrate W.

On the contrary, when only one of the two motors M1 and M2 is driven or when the driving directions (the directions of rotations) of the motors are different from each other, force asymmetric with respect to the line segment LS acts upon the bevel unit 11A and the bevel unit 11A rotates about the rotation center A1. For instance, when only the motor M1 is driven in the forward direction, or when the motor M2 is driven in the backward direction while the motor M1 is driven in the forward direction, the bevel unit 11A rotates clockwise about the rotation center A1.

Figure 4:
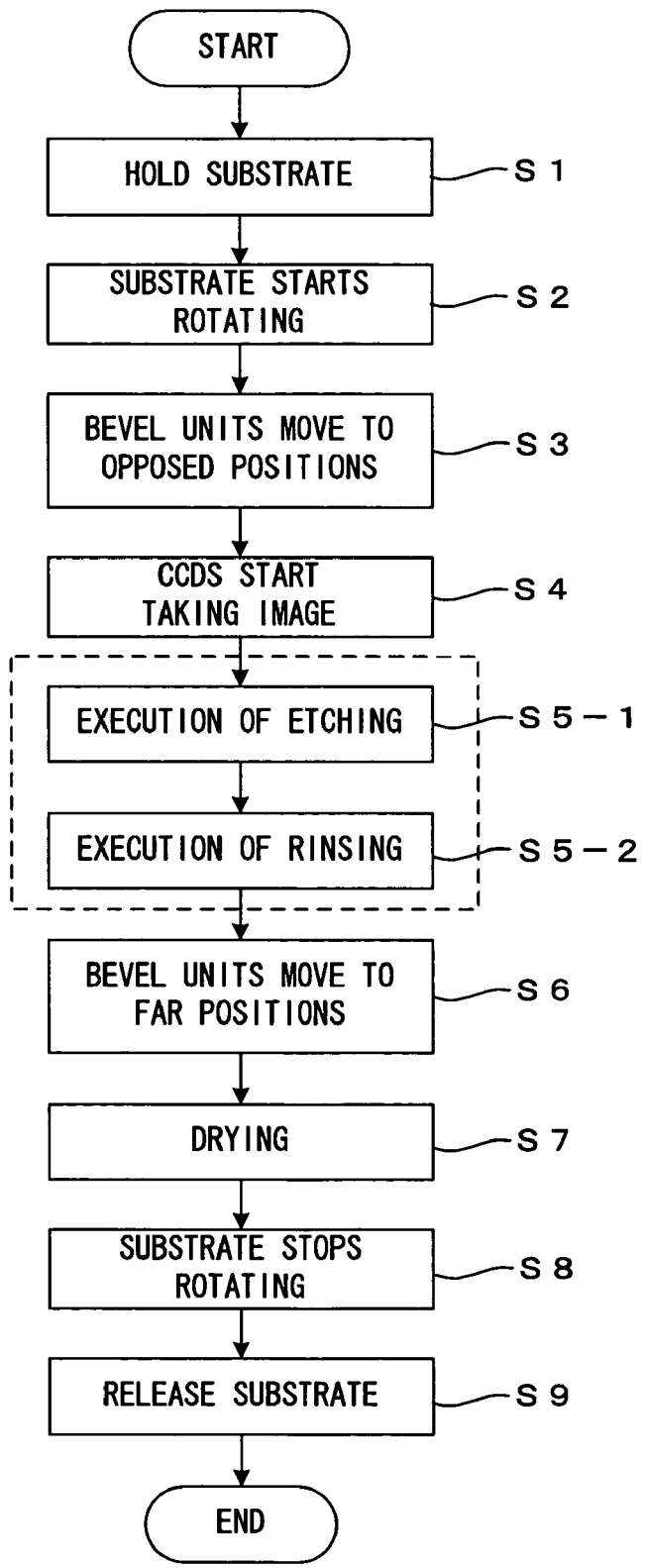
FIG. 4 is a flow chart for describing operations of the substrate processing apparatus shown in FIG. 1.

Operations of the substrate processing apparatus having the structure above will now be described with reference to FIGS. 4 and 5. FIG. 4 is a flow chart for describing operations of the substrate processing apparatus shown in FIG. 1. FIG. 5 is a drawing for describing the operations of the substrate processing apparatus shown in FIG. 1. This apparatus treats the substrate W with bevel etching (etching+rinsing+drying), the substrate W on the front surface Wf of which is formed a thin film TF such as a metal layer, a photoresist layer, or the like, upon loading of the substrate W as it remains in a face-down and approximately horizontal posture.

First, at Step S1, the vacuum chuck 1 sucks and holds the substrate W approximately at the center of a back surface Wb of the substrate W which has been transported with its front surface Wf directed toward below. At this stage, the two bevel units 11A and 11B are aligned to the far positions P2 which are spaced apart from the rim portion of the substrate W (the positions denoted at the dotted lines in FIG. 1), which prevents interference with the substrate W.

The motor 2 then starts driving and rotates the substrate W (Step S2). At the same time as Step S2 or prior to or after Step S2, the two bevel units 11A and 11B are moved to the proximity of the rim portion of the substrate W and aligned to the opposed positions P1 (the positions denoted at the solid lines in FIG. 1) (Step S3). That is, as an operator selects a recipe corresponding to the type of the substrate, the type of the thin film and the like on an operation panel (not shown) of the substrate processing apparatus, the bevel units 11A and 11B move toward the inner side of the substrate (the right-hand side in FIG. 3) each by the amount of movements which has been determined in advance in the recipe, and the processing defining members 117 are positioned suitably for the rim etching width EH.

At the same time or before or after positioning of the bevel units 11A and 11B at the opposed position P1, the CCDs 21 and 22 start taking the image of the rim portion of the substrate W (Step S4). Thus taken images are fed to the image processing part 23 which will then detect the position of the circumferential edge surface of the substrate W. Since the distances between the processing liquid nozzles 115 and 116 (and the processing defining members 117) and the CCDs 21 and 22 are constant, detection of the position of the circumferential edge surface of the substrate W achieves detection of the distances between the circumferential edge surface of the substrate W and the processing liquid nozzles 115 and 116.

Even in the case where the CCDs 21 and 22 take the image of the notch NT formed in the rim portion of the substrate W and the image processing part 23 receives image signals containing the notch NT, the image processing part 23 filters out and removes image information related to the notch NT. Since the distances between the circumferential edge surface of the substrate W and the processing liquid nozzles 115 and 116 are detected based on the image information exclusive of the notch NT, the distances can be detected precisely.

In the control unit 3, the detected distances which are detected by the image processing part 23 are compared against the set distances set by the recipe, and the amount of displacement between the detected distances and the set distances is calculated. The control unit 3 drives at least one of the motors M1 and M2 in accordance with the amount of displacement, thereby adjusting the distances from the circumferential edge surface of the substrate W to the processing liquid nozzles 115 and 116 so that the distances will be suitable considering the rim etching width EH.

In a situation as that shown in FIG. 5A for example, that is, when the deviation of distance between the substrate position Ga (the contour outline of the substrate W) detected by the image processing part 23 and the substrate position Wa (the contour outline of the substrate W) located at the set distances in accordance with the recipe is approximately constant as for both the CCDs 21 and 22, the control unit 3 may drive the motors M1 and M2 in the following manner. That is, the control unit 3 drives the motors M1 and M2 in synchronization to each other, moving the bevel units 11A and 11B toward the inner side of the substrate and matching the detected position Ga with the set position Wa. The set position Wa is a proper substrate position (the contour outline of the substrate W) which the CCDs 21 and 22 are supposed to acquire upon alignment of the bevel units 11A and 11B (the processing liquid nozzles 115 and 116) at the positions demanded by the recipe so as to attain the desired rim etching width EH.

Meanwhile, in a situation as that shown in FIG. 5B, i.e., when the substrate position Gb (the contour outline of the substrate W) detected by the image processing part 23 is on the outer side of the substrate relative to the set position Wa as for the CCD 21 but on the inner side of the substrate relative to the set position Wa as for the CCD 22, the control unit 3 may drive the motors M1 and M2 in the following manner. That is, the control unit 3 drives only the motor M1 in the forward direction, only the motor M2 in the backward direction, or the motor M1 in the forward direction and the motor M2 in the backward direction. The drive rotates the bevel units 11A and 11B clockwise and matches the substrate position Gb with the set position Wa.

In a condition that the distances from the circumferential edge surface of the substrate W to the processing liquid nozzles 115 and 116 are adjusted in this fashion, the gas nozzles 113 and 114 discharge nitrogen gas toward the substrate W. The chemical solution supply unit 13 pumps out the chemical solution suitable to etching toward the chemical solution nozzle 115 under pressure, the chemical solution fills up the micro-space GP liquid-tight which is formed between the processing defining member 117 and the rim portion of the front surface Wf of the substrate, and a part of the chemical solution spreads toward the outer side of the substrate beyond the processing defining member 117. This etches and removes unwanted matter (the thin film TF) from the rim portion of the front surface Wf of the substrate in the rim etching width EH which is determined by the position of the processing defining member 117 (Step S5-1; ETCHING). The etching is performed successively as the substrate rotates, thereby etching the rim portion of the front surface Wf of the substrate in the rim etching width EH precisely and uniformly all around the substrate.

At the same time as the etching, the rinsing liquid supply unit 14 pumps out the rinsing liquid to the rinsing liquid nozzle 116 under pressure, and the rinsing liquid is supplied to constant positions from the circumferential edge surface of the substrate W. This achieves rinsing of the etched rim portion of the front surface Wf of the substrate (Step S5-2; RINSING). The CCDs 21 and 22 are located away from the chemical solution nozzle 115 and the rinsing liquid nozzle 116 at this stage. Further, discharge of nitrogen gas at the gas nozzles 113 and 114 removes the chemical solution and the rinsing liquid before the chemical solution and the rinsing liquid reach the CCD 22 which is on the downstream side of rotations of the substrate W. Adhesion of the processing liquids to the CCDs 21 and 22 is thus prevented.

As the etching and the rinsing complete, the bevel units 11A and 11B are moved and aligned to the far positions P2 which are spaced apart from the rim portion of the substrate W (Step S6). The motor 2 then rotates at a higher speed and rotates the substrate W fast. After draining off liquid components adhering to the substrate W and drying the substrate W (Step S7; DRYING), the substrate W stops rotating (Step S8). As the bevel etching thus completes, after confirmation that it is possible to handle the substrate W with a transportation arm or the like, the vacuum chuck 1 releases the substrate (Step S9). The transportation arm or the like then takes thus bevel-etched substrate W. This ends the series of bevel etching operations.

As described above, according to this embodiment, using the CCDs 21 and 22 and the image processing part 23, the distances between the circumferential edge portion of the rotating substrate W and the processing liquid nozzles 115 and 116 are detected with non-contact. The bevel units 11A and 11B are driven based on detection signals, which adjusts the positions of the processing liquid nozzles 115 and 116 (and the processing defining members 117). Hence, the processing liquid nozzles 115 and 116 are positioned using the position of the circumferential edge surface of the substrate W as a reference, thereby maintaining the distances between the circumferential edge surface of the rotating substrate W and the processing liquid nozzles 115 and 116 constant. Supplying the processing liquids to the rim portion of the rotating substrate W from the processing liquid nozzles 115 and 116 therefore, it is possible to control the rim etching width precisely and uniformly all around the substrate. Further, the position of the circumferential edge surface of the substrate W is detected without contacting the substrate W, which prevents inconvenience such as damaging, contamination or the like of the substrate W.

Further, according to this embodiment, the CCDs 21 and 22 are fixed to the bevel units 11A and 11B, and the bevel units 11A and 11B are driven, thereby moving the CCDs 21, 22 and the processing liquid nozzles 115, 116 (and the processing defining members 117) as one unit. Since this always ensures constant distances between the CCDs 21 and 22 and the processing liquid nozzles 115 and 116, detection of only the position of the circumferential edge surface of the substrate W with the CCDs 21 and 22 efficiently attains detection of the distances between the circumferential edge surface of the substrate W and the processing liquid nozzles 115 and 116. This permits simplifying the structure of the detecting elements and realizes quick detection.

Further, according to this embodiment, since the two CCDs 21 and 22 are disposed away from the processing liquid nozzles 115 and 116 respectively, it is possible to prevent adhesion of the processing liquid splashed from the processing liquid nozzles 115 and 116 to the CCDs 21 and 22. As the two CCDs 21 and 22 are located on the both sides of the processing liquid nozzles 115 and 116, it is possible to accurately calculate the position of the circumferential edge surface of the substrate W against which the processing liquid nozzles 115 and 116 are opposed.

The present invention is not limited to the embodiments above, but may be modified in various manners in addition to the preferred embodiments above, to the extent not deviating from the object of the invention. For instance, although the embodiment above uses the CCDs 21 and 22 as the detectors (imaging parts) of the detecting elements, this is not limiting. A light projector 24 which projects light traversing the rim portion of the substrate W and a light receiver 25 which receives light from the light projector may be disposed as shown in FIG. 6 for example, and through detection of the position of the circumferential edge surface of the substrate from a change of the amount of light which the light receiver 25 receives, the distances between the circumferential edge surface of the substrate and the processing liquid nozzles 115 and 116 may be detected. To be more specific, the light projector 24 and the light receiver 25 may be arranged linearly in the direction (the radial direction of the substrate W) of driving a bevel unit (not shown), and the position of the circumferential edge surface of the substrate may be detected based on the amount of light blocked by the substrate W and the amount of light passed outside the substrate W. In this instance as well, the light projector 24 and the light receiver 25 are preferably disposed away from the processing liquid nozzles considering elimination of an influence of the processing liquid.

An optical distance sensor which detects a distance to the circumferential edge surface of the substrate may be used as a detecting element. In this instance, a light receiver receives reflection light (laser light, etc.) reflected by the circumferential edge surface of the substrate W after projected by a light projector, and by triangulation method for instance, the distance from the sensor to the circumferential edge surface of the substrate W (or an amount of a displacement of the position of the circumferential edge surface of the substrate W) is detected.

Further, although the detectors (imaging parts) such as the CCDs 21 and 22 are fixed to the bevel units 11A and 11B in the embodiment above, the detectors (imaging parts) may be disposed separately from the bevel units 11A and 11B and the distances between the circumferential edge surface of the substrate and the processing liquid nozzles 115 and 116 may be detected outside the bevel units 11A and 11B.

Further, although the embodiment above uses two CCDs, to the extent acceptable in terms of the influence of the processing liquid and the detection accuracy, e.g., if it is possible to dispose a CCD in the proximity of the processing liquid nozzles, only one CCD may be used. This similarly applies to the two motors M1 and M2 which are disposed as driver elements, and if it is acceptable in terms of the positioning accuracy, only one driver element may be used.

Further, although bevel etching is performed with the two bevel units 11A and 11B disposed facing each other on the both sides of the substrate W in the embodiment above, the number, the arrangement, the shape and the like of the bevel units may be determined freely.

Further, although bevel etching is performed while supplying the processing liquid to the rim portion of the front surface Wf of the substrate from below the substrate W in a condition that the front surface Wf of the substrate is directed toward below (in a face-down posture) in the embodiment above, bevel etching may be performed while supplying the processing liquid to the rim portion of the front surface Wf of the substrate from above the substrate W in a condition that the front surface Wf of the substrate is directed toward above (in a face-up posture).

Further, in the embodiment above, the substrate W is rotated about the rotation axis (the rotation center A0) which extends vertically, but the substrate W may be held and rotated about the rotation axis which is inclined by 90 degrees.

Further, in the embodiment above, positioning of the bevel unit 11A is realized by activating the motors M1 and M2, but positioning to the opposed position P1 may be realized by means of the drive provided by the motors M1 and M2 and displacement between the detected distances which are detected by the image processing part 23 and the set distances may be adjusted using a nozzle moving mechanism which moves the processing liquid nozzles. The structure shown in FIG. 7 for instance may be used.

In the embodiment shown in FIG. 7, a bevel unit 111C comprises a main unit member 111C, processing liquid nozzles 115C and 116C in the form of tube, and a nozzle moving mechanism 191. The processing liquid nozzles 115C and 116C are disposed inside a hole 190 which is formed in the main unit member 111C. The nozzle moving mechanism 191 is fixed to a top surface of the main unit member 111C, and holds and moves the processing liquid nozzles 115C and 116C. The nozzle moving mechanism 191 may be a known mechanism such as a feed screw mechanism which uses a guide and a ball screw.

In this structure, the bevel unit 11C is aligned to the opposed position P1 in the following manner. First, the motors M1 and M2 make the bevel unit 11C roughly aligned to the opposed position P1. In accordance with an amount of a displacement between the circumferential edge surface of the substrate W and the processing liquid nozzle 115C (116C), the control unit 3 slightly moves the nozzle moving mechanism 191 and adjusts the distance from the circumferential edge surface of the substrate W to the processing liquid nozzle 115C (116C) such that the distance will correspond to the rim etching width EH. In short, the bevel unit 11C remains still and the processing liquid nozzles alone move during etching in this embodiment.

Although the invention has been described with reference to specific embodiments, this description is not meant to be construed in a limiting sense. Various modifications of the disclosed embodiment, as well as other embodiments of the present invention, will become apparent to persons skilled in the art upon reference to the description of the invention. It is therefore contemplated that the appended claims will cover any such modifications or embodiments as fall within the true scope of the invention.

What is claimed is:

1. A substrate processing apparatus which treats a substrate with predetermined processing by holding said substrate in a predetermined position and supplying a processing liquid to said substrate while rotating said substrate, comprising:

a bevel unit which includes a first nozzle and a second nozzle, which supply said processing liquid to a rim portion of said substrate, said bevel unit being structured to rotate freely about a rotation axis which extends in a direction of a rotation axis of said substrate;

a drive mechanism which moves said nozzle to an opposed position and to a far position by driving said bevel unit, the opposed position being a position which is opposed against the rim portion of said substrate, and the far position being a position which is away from said substrate;

a first optical distance sensor and a second optical distance sensor disposed to perform non-contact detection of a distance between said nozzle and a circumferential edge surface of said substrate; and a controller which is configured to rotate said bevel unit about the rotation axis to adjust the distance between said first and second nozzles and the circumferential edge surface of said substrate by controlling said drive mechanism based on detection signals from said first and second optical distance sensors, wherein said bevel unit includes a back-surface-side main unit member which is opposed against a back surface of said substrate and a front-surface-side main unit member which is opposed against a front surface of said substrate and is provided with said nozzles;

said second nozzle being disposed on an upstream side in a rotation direction of said substrate relative to said first nozzle, said first optical distance sensor being disposed in said bevel unit on a downstream side in the rotation direction of said substrate relative to said first nozzle, and said second optical distance sensor being disposed in said bevel unit on an upstream side in the rotation direction of said substrate relative to said second nozzle.

2. The substrate processing apparatus of claim 1, wherein said first and second optical distance sensors are fixed to said bevel unit, and
said drive mechanism moves said first and second optical distance sensors and said first and second nozzles as one unit by driving said bevel unit.

3. The substrate processing apparatus of claim 1, wherein said first and second optical distance sensors are disposed respectively on opposite sides of said first and second nozzles and at positions away from said first and second nozzles.

4. The substrate processing apparatus of claim 1, wherein said bevel unit is structured to move freely in a radial direction of said substrate, and
said controller is configured to rotate said bevel unit about the rotation axis or to move said bevel unit in the radial direction of said substrate to adjust the distance, based on the detection signals from said first optical distance sensor and said second optical distance sensor.

5. A substrate processing apparatus which treats a substrate with predetermined processing by holding said substrate in a predetermined position and supplying a processing liquid to said substrate while rotating said substrate, comprising:
a bevel unit which includes a first nozzle and a second nozzle, which supply said processing liquid to a rim portion of said substrate, said bevel unit being structured to rotate freely about a rotation axis which extends in a direction of a rotation axis of said substrate;

a drive mechanism which moves said nozzle to an opposed position and to a far position by driving said bevel unit, the opposed position being a position which is opposed against the rim portion of said substrate, and the far position being a position which is away from said substrate;

a first light projector and a second light projector which projects light traversing the rim portion of said substrate and a first light receiver and a second light receiver which respectively receive light from said first and second light projectors, said light projectors together with said light receivers being disposed to perform non-contact detection of a distance between said nozzle and a circumferential edge surface of said substrate based on a change of an amount of light which said light receivers receives; and a controller which is configured to rotate said bevel unit about the rotation axis to adjust the distance between said first and second nozzles and the circumferential edge surface of said substrate by controlling said drive mechanism based on detection signals from said first and second light receivers, wherein said bevel unit includes a back-surface-side main unit member which is opposed against a back surface of said substrate and a front-surface-side main unit member which is opposed against a first surface of said substrate and is provided with said nozzles;

said second nozzle being disposed on an upstream side in a rotation direction of said substrate relative to said first nozzle, said first light projector and said first light receiver being disposed in said bevel unit on a downstream side in the rotation direction of said substrate relative to said first nozzle, and said second light projector and said second light receiver being disposed in said bevel unit on an upstream side in the rotation direction of said substrate relative to said second nozzle.

6. The substrate processing apparatus of claim 5, wherein said bevel unit is structured to move freely in a radial direction of said substrate, and
said controller is configured to rotate said bevel unit about the rotation axis or to move said bevel unit in the radial direction of said substrate to adjust the distance, based on the detection signals from said first and second light projectors and said first and second light receivers.

* * * * *